(12) United States Patent
Sommer et al.

(10) Patent No.: US 6,930,540 B2
(45) Date of Patent: Aug. 16, 2005

(54) INTEGRATED CIRCUIT WITH VOLTAGE DIVIDER AND BUFFERED CAPACITOR

(75) Inventors: Michael Sommer, Raubling (DE); Helmut Fischer, Oberhaching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/460,714

(22) Filed: Jun. 12, 2003

(65) Prior Publication Data

US 2003/0231049 A1 Dec. 18, 2003

(30) Foreign Application Priority Data

Jun. 12, 2002 (DE) .......................................... 102 26 057

(51) Int. Cl.[7] .................................................. G05F 3/02
(52) U.S. Cl. ........................ 327/540; 327/334; 327/530
(58) Field of Search ................................. 327/540, 541, 327/546, 334, 530; 323/316

(56) References Cited

U.S. PATENT DOCUMENTS

| | | | |
|---|---|---|---|
| 5,874,830 A | | 2/1999 | Baker |
| 6,021,082 A | | 2/2000 | Shirai |
| 6,078,210 A | * | 6/2000 | Uchida et al. ............... 327/530 |
| 6,337,598 B1 | * | 1/2002 | Ohno .......................... 327/540 |
| 6,498,469 B2 | * | 12/2002 | Kobayashi ................... 323/313 |
| 6,650,175 B2 | * | 11/2003 | Messager ..................... 327/541 |
| 2003/0042971 A1 | * | 3/2003 | Oikawa et al. ............. 327/540 |
| 2004/0008079 A1 | * | 1/2004 | Osamura et al. ............ 327/540 |

* cited by examiner

Primary Examiner—Terry D. Cunningham
(74) Attorney, Agent, or Firm—Laurence A. Greenberg; Werner H. Stemer; Ralph E. Locher

(57) ABSTRACT

An integrated circuit has a voltage divider that is configured to save current. The circuit includes a capacitor that is inventively connected to a potential sink or potential source by way of a charge branch even when the voltage divider is inactive. The capacitor is thus held at a charge state that corresponds to the charge state given an active voltage divider. The voltage divider thus becomes functional in a shorter time following activation, because the capacitor does not require recharging.

6 Claims, 1 Drawing Sheet

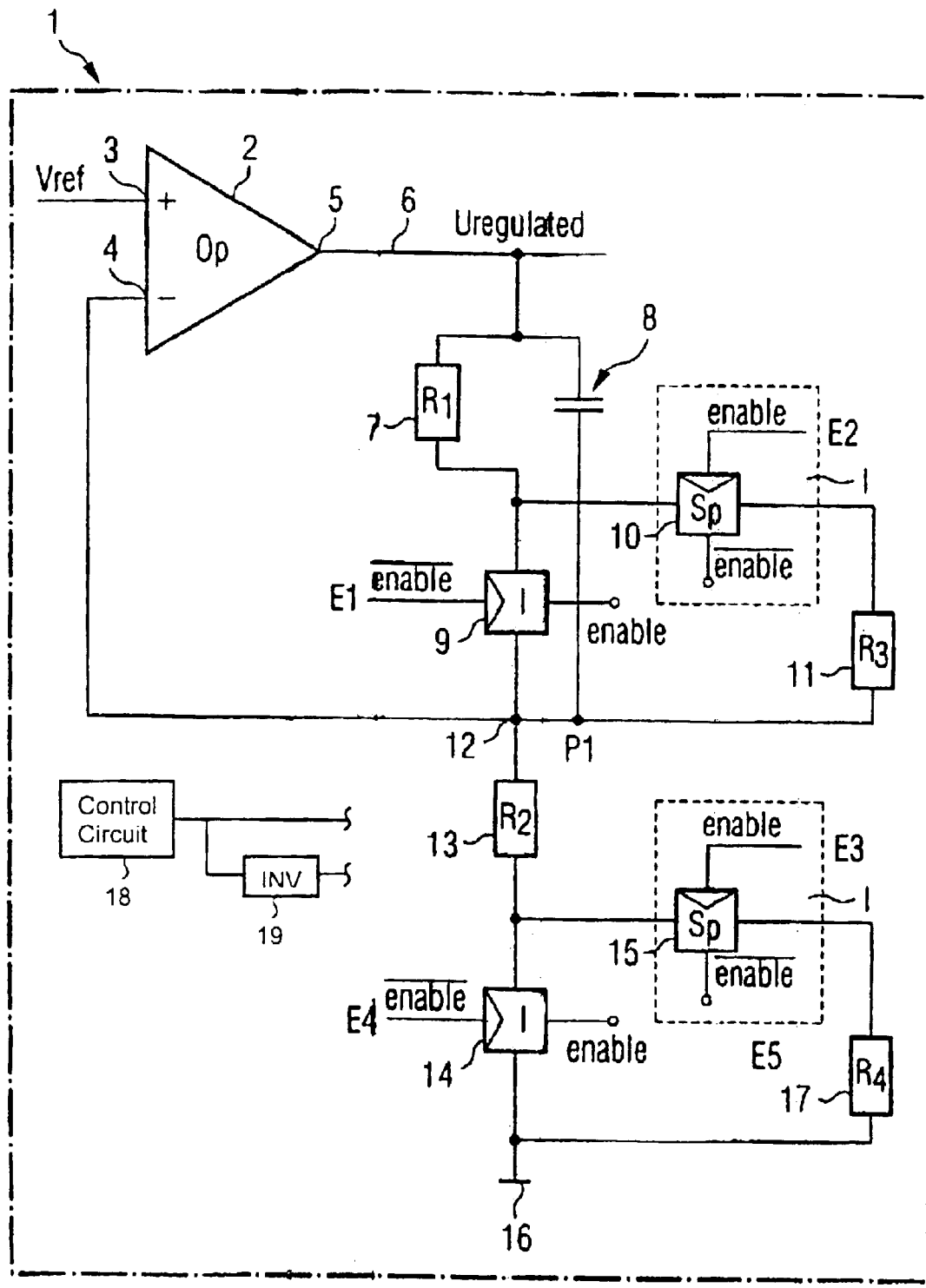

INTEGRATED CIRCUIT WITH VOLTAGE DIVIDER AND BUFFERED CAPACITOR

BACKGROUND OF THE INVENTION

Field of the Invention

The invention relates to an integrated circuit, particularly a DRAM memory circuit or memory module with a voltage divider. The module has a series circuit composed of a first and second resistor interposed between an output line and a potential sink or potential source. A capacitor is connected, by way of a first terminal, to the input of the first resistor parallel to the first resistor. An activation circuit allows the series circuit to be activated or deactivated.

Integrated circuits, particularly DRAM circuits, comprise voltage dividers which are utilized for operating the integrated circuit. The voltage dividers consume current even when the integrated circuit that is powered by the voltage divider is not working.

Integrated circuits which are utilized in mobile devices such as a laptop, for example, should consume as little current as possible. A known technique for reducing the current consumption is to disconnect parts of the integrated circuit, thereby reducing the closed-circuit or at rest current.

Voltage dividers are also disconnected. But voltage dividers comprise parallel capacitors. Heretofore, the capacitor has also been disconnected from the voltage supply with the disconnecting of the voltage divider. But it turns out that, when the voltage divider is reactivated, i.e. connected to a potential sink or potential source, a state wherein the voltage divider is operational again is achieved only after a relatively long delay.

SUMMARY OF THE INVENTION

It is accordingly an object of the invention to provide an integrated circuit with a voltage divider and a buffered capacitor which overcomes the above-mentioned disadvantages of the heretofore-known devices and methods of this general type and which becomes operational again in a shorter time when the voltage divider is activated.

With the foregoing and other objects in view there is provided, in accordance with the invention, an integrated circuit, in particular a DRAM memory module. The novel circuit comprises:

a voltage divider having a series circuit formed with a first resistor and a second resistor connected between an output line and a potential sink or potential source, and a node between said first resistor and said second resistor;

an activation circuit for selectively activating and deactivating said series circuit;

a capacitor connected in parallel with said first resistor, said capacitor having a first terminal connected to an input of said first resistor and a second terminal connected to said node between said first resistor and said second resistor; and a charge branch connected to said second terminal of said capacitor and to said potential sink or potential source, said charge branch enabling a voltage supply for said capacitor when said series circuit of said voltage divider is deactivated.

Experiments have shown that, when the voltage divider is disconnected, i.e. deactivated, the capacitor that is coupled with the voltage divider is discharged. It is therefore necessary for the full functionality of the voltage divider, that the capacitor be recharged to the charge status of the operational condition with the activation of the voltage divider. However, charging the capacitor takes up a defined charging time depending on the charging current and the capacity of the capacitor. A charging branch is inventively provided, which retains the connection of the capacitor to a potential source or potential sink when the voltage divider is inactive.

This guarantees that the capacitor stays charged at the charge status corresponding to the operational condition of the voltage divider, despite the voltage divider being disconnected. That way, the capacitor does not need to be recharged with the activating of the voltage divider. This makes possible a fast activation of the voltage divider.

In accordance with a preferred embodiment, an output of the first resistor of the voltage divider is connected to an inverted input of an operational amplifier by way of an activation circuit. When the voltage divider is deactivated, the activation circuit interrupts the connection between the first resistor and the inverted input of the operational amplifier. It is advantageous with respect to fast activation of the voltage divider when the output of the first resistor is additionally connected to the inverted input. A conduction branch with a third resistor is inventively provided for that purpose, which connects the first resistor to the inverted input of the operational amplifier even when the voltage divider is in the inactive state. The output of the first resistor remains at the potential of the inverted input even when the voltage divider is inactive.

In a further preferred embodiment, the operational amplifier is constructed as a regulated voltage source. The utilization of the inventive circuit configuration for regulated voltage sources is particularly advantageous in memory circuits, because these circuits comprise regulated voltage sources that are disconnected in order to reduce the closed-circuit current.

In accordance with an additional feature of the invention, the activation circuit comprises a first switch and a second switch which can be switched simultaneously, the first switch being connected to the output of the first resistor, and the second switch being connected to the output of the second resistor.

In accordance with again an additional feature of the invention, the activation circuit comprises third and fourth switches, the third switch being connected to the output of the first resistor and to the input of the third resistor, and the fourth switch being interposed between the second resistor and the charging branch. Furthermore, the first and second switches are always connected inverse to the third and fourth switches. The first and second switches are thus switched to conduct when the third and fourth switches are switched to block, and conversely, the first and second switches are switched to block when the third and fourth switches are switched to conduct. That way, a simple drive is provided for activating and deactivating the voltage divider.

Other features which are considered as characteristic for the invention are set forth in the appended claims.

Although the invention is illustrated and described herein as embodied in an integrated circuit with voltage divider and buffered capacitor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The drawing is a schematic circuit diagram of an integrated circuit according to the invention.

DESCRIPTION OF THE PREFERRED EMBODIMENTS

Referring now to the sole FIGURE of the drawing in detail, there is shown an overview of a DRAM (dynamic random access memory) circuit. The complex structure of the DRAM memory module will not be described. Rather, only the circuit components that are required for understanding the invention will be elaborated. The description of the invention in the example of a DRAM memory module does not limit the utility of the inventive teaching, which can be applied in a wide variety of integrated circuits wherein fast activation of a voltage divider is advantageous.

Besides a number of circuit components, the DRAM memory module comprises a regulated voltage source with an operational amplifier 2 including a non-inverting input 3, an inverting input 4, and an output 5. The output 5 is connected to a supply line 6, which supplies the circuit components of the memory module 1 with a desired voltage. The supply line 6 is connected to a first terminal of a first resistor ($R_1$) 7 and a first terminal of a capacitor 8. A second terminal of the first resistor 7 is connected to a first transfer gate 9, which has the function of a first switch. An output of the first transfer gate 9 is connected to a node 12. An input of a second transfer gate 10 is connected to the input of the first transfer gate 9. An output of the second transfer gate 10 is connected to a terminal of a third resistor ($R_3$) 11. A second terminal of the third resistor 11 is connected to the node 12. A second terminal of the capacitor 8 is connected to the node 12. The second node 12 is connected to the inverting input 4 of the operational amplifier 2. A first terminal of a second resistor ($R_2$) 13 is also connected to the node 12. A second terminal of the second resistor 13 is connected to an input of a third transfer gate 14 and an input of a fourth transfer gate 15. An output of the third transfer gate 14 is connected to a potential sink 16. An output of the fourth transfer gate 15 is connected to a first terminal of a fourth resistor ($R_4$) 17. A second terminal of the fourth resistor 17 is connected to the potential sink 16.

First control terminals of the first and third transfer gates 9, 14 are connected to an inverted enable signal. Second control terminals of the first and third transfer gates 9, 14 are connected to an enable signal. First control terminals of the second and fourth transfer gates 10, 15 are connected to an enable signal, and second control terminals of the second and fourth transfer gates 10, 15 are connected to an inverted enable signal. The enable signal is provided by a control circuit 18. The inverted enable signal is supplied to the first, second, third, and fourth transfer gates by way of the output of the control circuit and an inverter 19. The control circuit 18 and the inverter 19 are also disposed on the memory module 1.

The functioning of the inventive circuit configuration will now be described: In normal operation, a regulated voltage, which is regulated to the reference voltage at the non-inverting input 3, is released by the output 5 of the operational amplifier 2. To that end, the inverting input 4 of the operational amplifier 2 is supplied with a voltage signal which is provided by the voltage divider, which is determined substantially by the resistance values of the first and second resistors 7, 13. In the normal operational state, the first and third transfer gates 9, 14 are switched to conduct, and the second and fourth transfer gates 10, 15 are switched to block. To that end, the transfer gates 9, 10, 14, 15 are driven with the corresponding enable signals by means of the control circuit 18. In this circuit state, a current flow arises, which runs from the supply line 6 to the potential sink 16 by way of the first resistor 7, the first transfer gate 9, the second resistor 13, and the third transfer gate 14. A voltage arises at the node 12 therein, which is determined by the regulated voltage on the supply line 6 and the resistance values of the first and second resistors 7, 13. The capacitor 8 serves for buffering voltage fluctuations which may occur on the supply line 6. If the control circuit 18 determines that the voltage divider is inactive, then the control circuit 18 switches its output, so that the first and third transfer gates 9, 14 block, and the second and fourth transfer gates 10, 15 conduct. As a result, the direct connection between the second resistor 13 and the potential sink 16 is broken. In addition, the direct connection between the first resistor 7 and the node 12 is broken. Thus, a current flow from the supply line 6 directly to the potential sink 16 across the first resistor 13 and the second resistor 13 is interrupted. This saves current.

Unlike known circuit configurations, the second terminal of the capacitor 8 is still supplied with charge with the potential sink 16 by way of the second resistor 13, the fourth transfer gate 15, and the fourth resistor 17. The charge state at the capacitor before the first current path is disconnected is thus maintained. A small holding current flows for the capacitor 8, but this merely amounts to the leakage current of the capacitor 8. This current flow is thus small.

Beyond this, the effect of the second transfer gate 10 and the third resistor 11 is that the voltage that arises at the output of the first resistor 7 is the same as the voltage at the inverting input 4 of the operational amplifier 2.

In a preferred embodiment, the second and fourth transfer gates 10, 15 can be omitted. In this embodiment, the input of the third resistor 11 is connected directly to the output of the first resistor 7. Furthermore, in this embodiment, the input of the fourth resistor 17 is connected directly to the output of the second resistor 13. The resistance values for the third and fourth resistors 11, 17 are orders of magnitude larger than the resistance values for the first and second resistors, and consequently only small currents flow across the third and/or fourth resistors 11, 17 when the first and second transfer gates 9, 14 are conductive.

Instead of the potential sink 16, a potential source can be provided, which is utilized for setting a voltage ratio by means of the voltage divider with the active first and second resistors 7, 13.

The resistance values for the third and fourth resistors 11, 17 are expediently larger than the resistance values for the first and second resistors 7, 13 by powers of ten. Deviation from a known voltage divider with the first and second resistors 7, 13 for setting a wanted voltage ratio is prevented by selecting the third and fourth resistors 11, 17 with values with which the following relation is maintained: r1/r2=(r1+r3)/(r2+r4), where r1, r2, r3, r4 are the resistance values of the first, second, third, and fourth resistors, respectively.

We claim:

1. An integrated circuit, comprising:
   a voltage divider having a series circuit formed with a first resistor and a second resistor connected between a voltage output line and a potential sink or potential source, and a node between said first resistor and said second resistor;

an activation circuit for selectively connecting and disconnecting said series circuit between the voltage output line and the potential sink or potential source, said activation circuit comprising a first switch connected between an output of said first resistor and said node, and a second switch connected between said second resistor and said potential sink or potential source;

a capacitor connected in parallel with said first resistor, said capacitor having a first terminal connected to an input of said first resistor and a second terminal connected to said node between said first resistor and said second resistor; and a further resistor connected in series with said second resistor and in parallel with said second switch and between said node and said potential sink or potential source, said further resistor enabling a voltage supply for said capacitor when said first switch and said second switch are disconnected and said series circuit of said voltage divider is not directly connected between the voltage output line and the potential sink or potential source.

2. The integrated circuit according to claim 1 implemented in a DRAM memory module.

3. The integrated circuit according to claim 1, which further comprises:

an operational amplifier having a non-inverting input connected to receive a reference voltage, an inverting input, and the output line connected to said input of said first resistor;

said first resistor having an output connected to said inverting input of said operational amplifier by way of said activation circuit; and said third resistor conductively connecting said first resistor output to said inverting input even when the voltage divider is deactivated.

4. The integrated circuit according to claim 1, wherein:

said activation circuit comprises a third switch and a fourth switch;

said third switch is connected in between said third resistor and said first resistor;

said fourth switch is connected in between said second resistor and further resistor; and said first and second switches are always driven inverse to said third switch and said fourth switch.

5. An integrated circuit, comprising:

a voltage divider having a series circuit formed with a first resistor and a second resistor connected between an output line of a regulated voltage source and a potential sink or potential source, and a node between said first resistor and said second resistor;

an activation circuit for selectively connecting and disconnecting said voltage divider between the voltage output line and the potential sink or potential source, said activation circuit having:

a first switch connected in between said output of said first resistor and said node; and a second switch connected in between said second resistor and said potential sink or potential source;

a third resistor and a third switch connected in between said third resistor and said first resistor; and a fourth resistor and a fourth switch connected in parallel with said second switch; and wherein said first and second switches are always driven inverse to said third switch and said fourth switch; and a capacitor connected in parallel with said first resistor, said capacitor having a first terminal connected to an input of said first resistor and a second terminal connected to said node between said first resistor and said second resistor;

whereby said fourth resistor and said fourth switch enable a voltage supply for said capacitor when said first and second switches are disconnected.

6. An integrated circuit, comprising:

an operational amplifier having a reference voltage input, an inverting input, and a voltage output;

a voltage divider having a series circuit formed with a first resistor and a second resistor connected between said voltage output and a potential sink or potential source, and a node between said first resistor and said second resistor, said node being connected to said inverting input of said operational amplifier;

an activation circuit for selectively connecting and disconnecting said series circuit between the voltage output line and the potential sink or potential source, said activation circuit comprising a first switch connected between an output of said first resistor and said node, and a second switch connected between said second resistor and said potential sink or potential source;

a capacitor connected in parallel with said first resistor, said capacitor having a first terminal connected to an input of said first resistor and a second terminal connected to said node between said first resistor and said second resistor; and a further resistor connected in series with said second resistor and in parallel with said second switch and between said node and said potential sink or potential source, said further resistor enabling a voltage supply for said capacitor when said first switch and said second switch are disconnected and said series circuit of said voltage divider is not directly connected between the voltage output line and the potential sink or potential source.

* * * * *